United States Patent [19]
Gräber

[11] Patent Number: 5,814,548
[45] Date of Patent: Sep. 29, 1998

[54] PROCESS FOR MAKING N-CHANNEL OR P-CHANNEL PERMEABLE BASE TRANSISTOR WITH A PLURALITY LAYERS

[75] Inventor: Jürgen Gräber, Jülich, Germany

[73] Assignee: Forschungszentrum Julich GmbH, Julich, Germany

[21] Appl. No.: 914,496

[22] Filed: Aug. 19, 1997

Related U.S. Application Data

[60] Continuation of Ser. No. 616,663, Mar. 18, 1996, abandoned, which is a division of Ser. No. 256,600, Jul. 23, 1994, Pat. No. 5,541,424.

[30] Foreign Application Priority Data

Dec. 23, 1991 [DE] Germany .............................. 4142595.2
Dec. 23, 1991 [DE] Germany .............................. 4142654.1

[51] Int. Cl.⁶ ................................................. H01L 21/331
[52] U.S. Cl. .................. 438/347; 438/193; 148/DIG. 11
[58] Field of Search .................................... 438/347, 193; 257/266, 423; 148/DIG. 11

[56] References Cited

U.S. PATENT DOCUMENTS

| | | | |
|---|---|---|---|
| 3,381,189 | 4/1968 | Hinkle et al. | |
| 3,767,982 | 10/1973 | Teszner et al. | 31/235 |
| 4,171,995 | 10/1979 | Nishizawa et al. | 148/175 |
| 4,719,496 | 1/1988 | Capasso et al. | 357/4 |
| 4,758,534 | 7/1988 | Derkits, Jr. et al. | 437/89 |
| 4,866,500 | 9/1989 | Nishizawa et al. | 357/38 |
| 4,901,121 | 2/1990 | Gibson et al. | 357/15 |
| 4,903,089 | 2/1990 | Hollis et al. | 357/22 |
| 5,016,074 | 5/1991 | Sands | 357/34 |
| 5,122,853 | 6/1992 | Luth | 357/34 |
| 5,168,070 | 12/1992 | Luth | 437/31 |
| 5,175,597 | 12/1992 | Cachier et al. | 257/267 |
| 5,541,424 | 7/1996 | Graber | 257/135 |

Primary Examiner—John Niebling
Assistant Examiner—Long Pham
Attorney, Agent, or Firm—Herbert Dubno

[57] ABSTRACT

A method for producing an electronic component with a plurality of layers fabricating in a laminated composite, comprising laterally structuring at least one of the layers having a p or n conductivity characteristic by forming one of the layers in a sieve shape with a multiplicity of openings therein on a second layer of a different p or n conductivity characteristic than that of the one of the layers so that a space charge zone is formed in the second of the layers at boundaries of the one of the layers along the openings in the one of the layers.

26 Claims, 2 Drawing Sheets

PROCESS FOR MAKING N-CHANNEL OR P-CHANNEL PERMEABLE BASE TRANSISTOR WITH A PLURALITY LAYERS

CROSS REFERENCE TO RELATED APPLICATION

This is a file-wrapper continuation of application Ser. No. 08/616,663 filed 18 Mar., 1996 now abandoned which is a divisional application of Ser. No. 08/256,600 filed 23 Jul., 1994 now U.S. Pat. No. 5,541,424.

FIELD OF THE INVENTION

The invention relates to an electronic component, especially a p-channel or n-channel permeable base transistor [PBT] with a plurality of layers, fabricated in a laminated composite, and with at least one laterally structured layer provided for controlling a space charge zone, especially a base of the electronic component.

The invention further relates to a process for manufacturing such a component.

BACKGROUND OF THE INVENTION

For use in super computers and fast data networks in the context of information technology, there are under development integrated circuits as fast microwave components. Of greater significance are integrated circuits on GaAs chips. Components which have been used hitherto in this context are the MESFET and the HEMT. They both are so-called field effect transistors (FET), in which the current transport is parallel to the surface of the chip. An important speed determining parameter, the so-called "transit time under the gate" is here limited by the smallest lateral structuring of the gate achievable lithographically.

The permeable base transistor (PBT) proposed already in 1979, also deals with the principle of a field effect transistor, although with a current flow direction perpendicular to the chip surface, in which the "transit time under the gate" was significantly reduced.

This had its basis in that the gate length in the vertical structuring was given by the thickness of the epitactically deposited base layer. With the methods of modern epitaxy, like modular beam epitaxy, metal organic gas phase epitaxy or metal organic molecular beam epitaxy (MOMBE, CBE, GSMBE) for production of the metallic structured base, layer thicknesses in the range of several atom layers can be produced in a controlled manner.

German Patent Application DE 40 25 269.8 describes a permeable base transistor of GaAs. Several layers are bonded with one another to form the active elements of the components, namely, emitter, base and collector. The lateral finger-like structured base forms at its boundary surface a pn transition with the material surrounding it. These components as a result of this characteristic have also been designated as permeable junction base transistors (PJBT). The thus formed space charge zone is controllable via the highly doped conductive base. The basic material for the region surrounding the base and to which the current channels between the fingers of the base belong, is GaAs with an n-doping in the range of $10^{17}$ to $10^{18}$ cm$^{-3}$. The p-doping of the base in the range of $10^{20}$ to $10^{21}$ cm$^{-3}$ is achieved with the aid of a carbon doping.

The space charge zones formed on the boundary surface of the base are used for control of the electric current in the region of the current channels with the aid of a suitable voltage bias on the base. In this case it is a disadvantage that in the remaining space charge zone in the region of the lateral boundary surface of the base layer and spreading out therefrom, there is a parasitic space charge capacitance which limits the switching speed of the component disadvantageously.

OBJECTS OF THE INVENTION

It is an object of the invention to provide an electronic component of the type described in which this effect is reduced and which enables an increased switching speed. It is also an object to provide a corresponding method of making such a component.

SUMMARY OF THE INVENTION

These objects are achieved with an electronic component wherein: a pn– transition is provided as the space charge zone with a p– conducting and a n– conducting layer, the laterally structured base is provided as one of the two layers forming the pn transition, and at least on one, especially on both of the two lateral boundary surfaces of the base, an additional layer is provided showing the same lateral structuring for the purposes of reducing parasitic space charge capacitance in the region of the lateral boundary surface provided on the base and especially which are not for control of the space charge zone.

Thus the laterally structured base is provided with one of the two pn transitions as the controllable space charge zone forming layer. The base contains on at least one of its two lateral boundary surfaces, at least one additional layer which is equally laterally structured and serves to reduce parasitic space charge capacitance in the region of the lateral boundary surface of the base.

An advantageous further reduction of this parasitic space charge capacitance is then achieved when on both lateral boundary surfaces of the base, such a layer is provided. It is therefore advantageous to provide a semiconductive material with a doping reduced by at least a factor of 10 with respect to the charge carrier doping of the base as the material for this additional layer.

It can be advantageous, moreover, that within the layer a variation of the doping is provided whereby during epitaxial growth, for example, a targeted change of the doping substance can be achieved. An especially advantageous embodiment of the component of the invention resides in that as the material for filling the respective region in the openings of the laterally structured base, which provides a single current channel, semiconductive material is provided which from the viewpoint of charge carrier doping, but also through the partial replacement of an element of the semiconductor (e.g. Al in GaAs Al$_x$Ga$_{1-x}$As), enables the deposition of a semiconductive heterostructure provides an additional possibility to improve the current transport mechanism.

A further, especially advantageous, embodiment of the electronic component resides in that the base is structured laterally in a sieve shape.

Advantageously, the base can have lateral circular-shaped and/or oval and/or square openings. This is possible because the PJBT is homogeneously constructed, i.e. only from semiconductor material (e.g. GaAs). In this case, the space charge zone extends substantially uniformly from all sides into the current channel. As a result the latter can be constricted in two lateral directions, i.e. two-dimensionally, upon spreading of the space charge zone. In addition, this sieve structure, by contrast with a finger-like structure of the base, achieves a higher rate of rise, i.e. greater slope, of the component for the same voltage change in the form of a greater current change in the channel.

Moreover a stronger spread of the space charge zone toward the hole center of the respective channel is generated by comparison to the spread of the space charge zone on the lateral boundary surface. This simplifies the lithographic requirements because for a given current control, by comparison 1.4 times larger dimensions are obtained. A reduction of the RC time constant results in an increase in the switching speed of the component. Anyway, it can be advantageous to select the appropriate lateral dimensions of the openings contained in the sieve shape or their lateral cross sections from opening to opening or optionally to make them different. Thus one obtains current channels with individually selectable lateral dimensions. It is conceivable to select the geometric dimensioning of the openings of the sieve shape in a mathematic relationship to respective other openings so that by such a definition of the sieve shape, a given sub-linear or super-linear or nonlinear current-voltage characteristic is obtained for the component. For example, one can conceive of a sieve shape of circular openings in which the diameters of the neighboring openings differ by a factor of 2.

The invention advantageously provides for the selection as the material for the base of AlGaAs. Where GaAs is selected as the basic material for the remaining active component layers within the layer sequence, a base composed of AlGaAs forms an etching stop or etching resist upon appropriate selection of the etching agent. As a consequence, also by the relatively reduced layer thickness of the base, for example, the contacting of the base layer can provide a targeted stopping of the etching of the layers applied over the base until the surface of the base chemically different from GaAs has been penetrated to the correct depth. It will be self understood that the choice of this material is not limited only to the base. In addition, there is a possible location of such an etch stop where the overgrown channel should begin and directly over the highly doped layers which must be formed with contacts.

The invention also comprises an electronic component with a plurality of layers fabricated in a laminated composite and with at least one laterally structured layer provided to control a space charge zone, characterized in that as the lateral structuring of this layer a sieve shape is provided.

This sieve structure, by contrast with a finger-like structure of the base, as previously noted achieves a higher rate of rise or greater slope of the component for the same voltage change in the form of a greater current change in the channel. Moreover a stronger spread of the space charge zone toward the hole center of the respective channel is generated by comparison to the spread of the space charge zone on the lateral boundary surface. This simplifies the lithographic requirements because already have a given current control, by comparison 1.4 times larger dimensions are obtained. With respect to the reduction of the RC time constant, this results in an increase in the switching speed of the component. Anyway, it can be advantageous to select the appropriate lateral dimensions of the openings contained in the sieve shape or their lateral cross sections from opening to opening or optionally to make them different. Thus, one obtains current channels with individually selectable lateral dimensions.

Thus the laterally structured base is provided with one of the two pn transitions as the controllable space charge zone forming layer. The base contains on at least one of its two lateral boundary surfaces, at least one additional layer which is equally laterally structured and serves to reduce parasitic space charge capacitance in the region of the lateral boundary surface of the base.

An advantageous further reduction of this parasitic space charge capacitance is then achieved when on both lateral boundary surface of the base, such a layer is provided. It is therefore advantageous to provide a semiconductive material with a doping reduced by at least a factor of 10 with respect to the charge carrier doping of the base as the material for this additional layer.

It can be advantageous, moreover, that within the layer a variation of the doping is provided whereby during epitaxial growth, for example, a targeted change of the doping substance can be achieved.

An especially advantageous embodiment of the component of the invention resides in that as the material for filling the respective region in the openings of the laterally structured base, which provides a single current channel, semiconductive material is provided which from the viewpoint of charge carrier doping, but also through the partial replacement of an element of the semiconductor (e.g. Al in GaAs to $Al_xGA_{1-x}AS$) so that the deposition of a semiconductive heterostructure provides an additional possibility to improve the current transport mechanism.

Further advantageous embodiments of the component according to the invention are found in the remaining claims and with respect to the process of the invention in the thereafter following claims.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
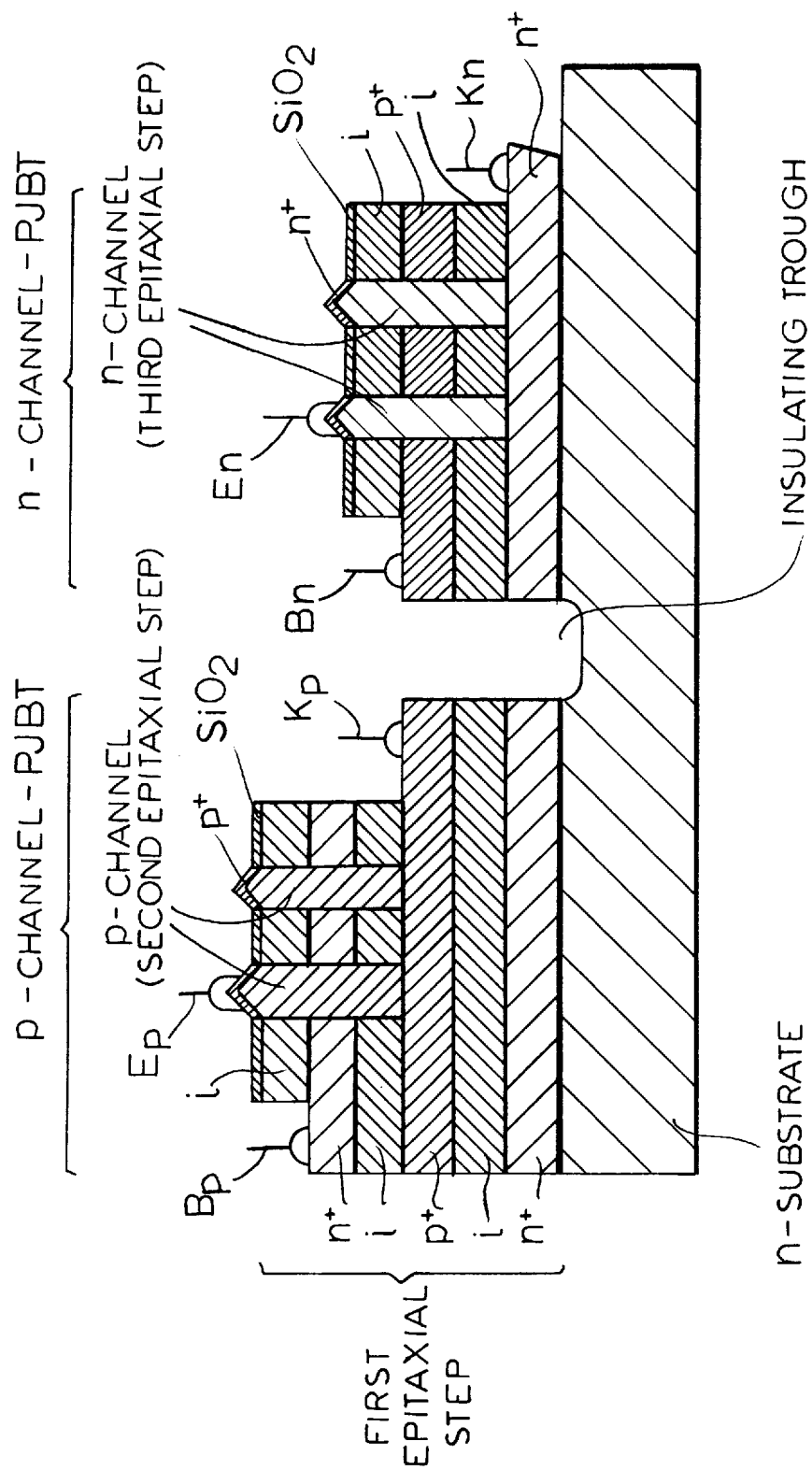
FIG. 1 is a cross sectional view diagrammatically showing a component according to the invention.

In FIG. 1, a component according to the invention is shown, comprised of a p-channel and an n-channel PJBT on a single chip.

From the point of view of the process, the component in FIG. 1 is fabricated as follows:

In a first epitaxial process, a layer sequence is produced in which, upon a substrate of n-doped GaAs, a $n^+$-i-$p^+$-i-$n^+$-i-layer sequence is grown epitactically in GaAs. ($n^+/p^+$ signifies n or p doped GaAs, i signifies intrinsic GaAs). In a subsequent step, an $SiO_2$ layer is vapor deposited upon this layer sequence. Thereafter, with the aid of an appropriate mask, the $SiO_2$ cover layer is opened to form an etching mask for the production of the current channels of the p-PJBT. Next, with the aid of a reactive ion etching process and the etching mask structured as defined from the $SiO_2$ cover layer, the region provided for growth of the current channels is etched free to the $p^+$ layer. In a further epitaxy step, this etched region is filled with p-doped GaAs.

Finally, even these field channels are covered with an $SiO_2$ layer.

To form the n-permeable base transistor shown in the right-hand part of the FIGURE, the there initially provided $SiO_2$ cover layer as well as the upper i-layer and $n^+$ layer are removed with the aid of an appropriate etching process. On the now highest lying plane or layer, $SiO_2$ is newly vapor deposited and in known manner opened with the aid of a suitable etching mask for forming the regions provided for the current channels of the n-PJBT. Thereafter these are filled up to the n⁺ layer etched region in a third epitaxial step with n-doped GaAs and closed with an SiO₂ cover layer. For contacting, the highly doped n⁺ or p⁺ layers are exposed by etching and simultaneously for separating the regions provided as p channel PJBT or n channel PJBT, an insulating trough is etched on the n-doped substrate and the contacts are produced.

The component shown in FIG. 1 represents an example of integration of multiple components on the same chip. It will be self-understood that further components, as, for example lasers constructed from PJBT's and photodetectors can be additionally provided upon the chip.

By corresponding wiring, which advantageously also can be effected through the p⁺ or n⁺ layers, or via additional, deeper lying layers, optional circuits can be fabricated, e.g. an inverter comparable to a C-MOS-inverter or a Darlington circuit.

For this purpose, it is of special significance that the individual transistors upon fabrication of the epitactic layer sequence, are provided with the SiO₂ cover layer. Advantageously these layer sequences are thus preserved so that at other locations on the same chip further individual components can be fabricated.

The cover layer can be made from SiO₂, but also from Si₃N₄ as indicated, or another suitable material. The material should thus be suitable as an etching mask, especially for reactive ion etching (RIE). For this the layer sequence in the semiconductor material (e.g. GaAs) should have as much as possible no diffusion and finally should enable selective epitaxy with sufficiently good characteristics.

Through the relatively small space-saving PJBT's of the invention and such an advantageous effective integration method, very high integration densities can be achieved. The above indicated cover layers can thus be used as "substrates" for further epitactically grown layer sequences so that therewith a three dimensional networking on a single chip can be realized.

Figure 2:
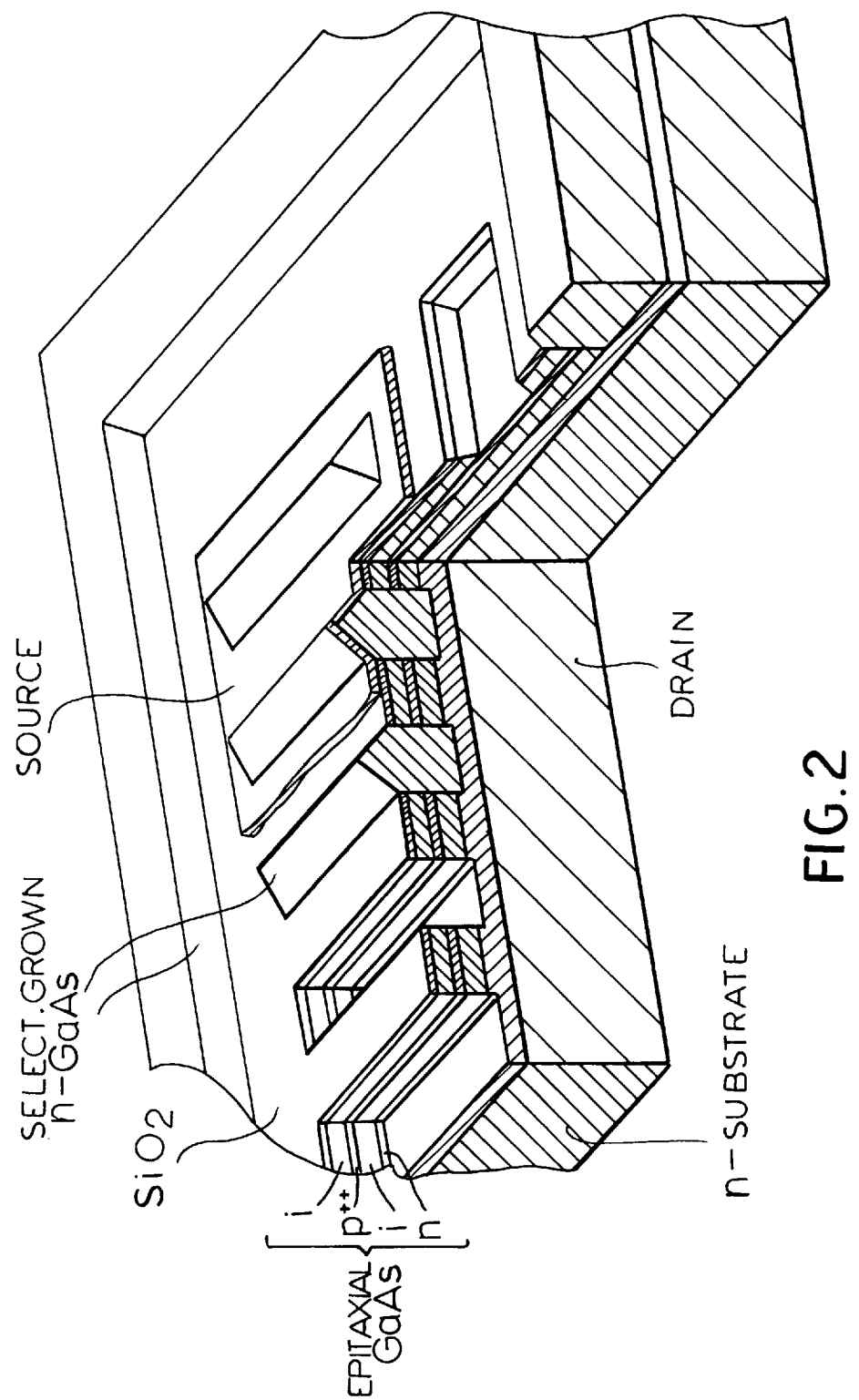
FIG. 2 is a perspective view, partly in section, of such a component.

In FIG. 2 the schematic section of a PJBT according to the invention is illustrated, with a p-doped, laterally rectangular, sieve-shaped base.

Upon a silicon doped GaAs wafer (n=3×10¹⁸ cm⁻³) a layer sequence: nip⁺⁺i is deposited by means of MOMBE to a thickness of 900 nm.

After the epitaxy, a 60 nm thin SiO₂ layer is vapor deposited and to improve the oxide, is tempered for several minutes at 550° C. Thereafter fine structuring up to 0.5 μm is generated photolithographically (UV) with a reverse lacquer (AZ 5206 IR).

Using CHF₃, the oxide is opened by reactive ion etching (RIE), the lacquer is removed with O₂ plasma and finally troughs are etched in the oxide transfer mask through all layers to the n GaAs. The SiO₂ is a satisfactory mask for H₂/CH₄-RIE since it enables the generation of substantially perpendicular flanks. With such a process a polyamide is formed that again with O₂-plasma can be removed.

Prior to the renewed insertion in the epitaxial growth apparatus, the structured wafer must be cleaned by a wet chemical etching whereby in comparison with the structuring only thin surface layers are removed and the SiO₂ layer is not attacked. The parameters for the second epitaxy are so selected that the channels are filled with GaAs of the desired doping and simultaneously the SiO₂ surface remains free. By means of this selectively filling epitaxy, only the previously etched troughs are filled and the distance between source and gate can be predetermined in the first epitaxy by the there-selected layer thickness of the intrinsic cover layer. Thereafter, with several masking steps utilizing a liftoff process, metallization is vapor deposited for the contacts. For the source contact Au—Ge/SiO₂ or Ni/Au—Ge/Ni can be utilized and can form by alloying at about 400° C. respective ohmic contacts.

Thereafter the SiO₂ and, with H₃PO₄:H₂O₂, the i-GaAs over the gate are removed. Ti/Au is vapor deposited to yield an ohmic contact to the p⁺⁺-GaAs and can also serve as contact reinforcement for the source contact. The drain contact is made above the backside of the wafer or simultaneously with the source contact. (NOTE: The drain, source and gate correspond to the concepts of collector, emitter and base).

I claim:

1. A process for producing an electronic component with a plurality of layers fabricated in a laminated composite, comprising laterally structuring at least one of said layers having a p or n conductivity characteristic by forming said one of said layers in a sieve shape with a multiplicity of openings therein on a second layer of a different p or n conductivity characteristic than that of said one of said layers so that a space charge zone is formed in said second of said layers at boundaries of said one of said layers along said openings in said one of said layers.

2. The process according to claim 1 wherein said one of said layers has circular and/or oval and/or square openings in a sieve shape.

3. The process defined in claim 1 wherein said layers are produced by the use of an epitaxial process.

4. The process defined in claim 3 wherein said one of said layers is structured with circular and/or oval and/or square openings.

5. A process for producing an electronic component having a plurality of layers fabricated in a laminated composite with at least one space-charge-zone-controlling base formed by laterally structuring one of said layers with a p or n conductivity characteristic to have sieve openings in said one of said layers on a second of said layers of a different p or n conductivity characteristic whereby space-charge zones are formed in said second of said layers at boundaries of said openings, said one of said layers constituting a laterally structured layer, said process comprising steps of:

(a) forming in said laminated composite a space charge zone by bonding a p-conducting layer together with an n-conducting layer to form a pn-transition and electrically connecting one of the p-conducting and n-conducting layers at this pn transition as the laterally structured base; and (b) at least on one of the p-conducting and n-conducting layers, providing an additional layer with an identical lateral structuring to that of the base for reducing parasitic space charge capitance in an outer region of the base, said additional layer being bonded to the base but being of a p or n conductivity characteristic so as not to control the space charge zone.

6. The process according to claim 5 wherein the additional layer on one of the p-conducting and n-conducting layers and bonded to the base is an intrinsic semiconductor having a doping reduced by at least a factor of 10 by comparison to the base doping.

7. The process according to claim 6 wherein said additional layer bonded to the base is so fabricated that it has a gradually falling doping profile.

8. The process according to claim 5 wherein a material is provided in openings of the laterally structured base for the purpose of forming individual current channels, and is a semiconductive material with doping concentrations stepped therein.

9. The process according to claim 5 wherein the base is structured laterally with a sieve shape.

10. The process according to claim 9 wherein the sieve shape is structured laterally by forming circular or oval or square openings in the base.

11. The process according to claim 5 wherein said base and said layers form a layer sequence fabricated by an epitaxial process.

12. The process according to claim 11 wherein the additional layer and the base are composed of AlGaAs which can have an aluminum proportion varying within the AlGaAs.

13. The process according to claim 12 wherein said layer sequence forms a plurality of transistors, and after fabrication of said layer sequence an individual transistor of this layer sequence is provided with an $SiO_2$ or $Si_3N_4$ layer.

14. A process for producing an electronic component, comprising the steps of
  (a) providing a plurality of layers of a different p or n conductivity characteristics fabricated in a laminated composite on a substrate; and
  (b) imparting to at least one of said layers a sieve shape with openings on another of said layers, thereby laterally structuring said one of said layers whereby said one of said layers controls a space charge zone in the other layer at boundaries of said opening.

15. A process according to claim 14 wherein said one of said layers has laterally circular or oval or square openings.

16. In a process for producing an electronic component having a plurality of layers in a laminate produced by an epitaxial process and at least one layer of a sieve shape with openings in said one layer on a second of said layers, thereby laterally structuring said one of said layers whereby said one of said layers controls a space charge zone in the second layer at boundaries of said openings.

17. The improvement defined in claim 16 wherein the laterally structured layer is structured with lateral circular or oval or square openings.

18. The improvement defined in claim 16 wherein, for forming the space charge zone, a p-conducting layer is bonded together with an n-conducting layer to form a pn transition.

19. The improvement defined in claim 18 wherein the laterally structured layer is comprised of p-doped or n-doped III-V semiconductive material.

20. The improvement defined in claim 18 wherein the laterally structured layer is composed of p-doped n-doped semiconductive material.

21. The improvement defined in claim 18 wherein the laterally structured layer is composed of p-doped or n-doped Si or $Si_x$ or $Si_xG_{1-x}$ semiconductive material.

22. The improvement defined in claim 18 wherein the laterally structured layer at least on one side has a further layer equivalently laterally structured with it and composed of intrinsic semiconductive material which has, relative to the material of the laterally structured layer, a doping reduced by at least a factor of 10.

23. The improvement defined in claim 22 wherein the further layer is so fabricated that it has a gradually falling doping profile.

24. The improvement defined in claim 23 wherein at least one of the layers is composed of AlGaAs.

25. The improvement defined in claim 14 wherein the electronic component is a vertical field effect transistor or a permeable base transistor or a combination of these transistors.

26. The improvement defined in claim 14 wherein said layers form an epitactic layer sequence of a transistor, this layer sequence being provided with an $SiO_2$ or an $Si_3N_4$ layer on top of said layer sequence.

* * * * *